US006933589B2

(12) United States Patent
Murthy et al.

(10) Patent No.: US 6,933,589 B2
(45) Date of Patent: Aug. 23, 2005

(54) METHOD OF MAKING A SEMICONDUCTOR TRANSISTOR

(75) Inventors: Anand S. Murthy, Portland, OR (US); Boyan Boyanov, Portland, OR (US); Ravindra Soman, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/917,165

(22) Filed: Aug. 11, 2004

(65) Prior Publication Data

US 2005/0079660 A1 Apr. 14, 2005

Related U.S. Application Data

(62) Division of application No. 10/197,041, filed on Jul. 16, 2002, now Pat. No. 6,812,086.

(51) Int. Cl.[7] .................. H01L 31/117; H01L 31/0288
(52) U.S. Cl. ..................... 257/616; 257/369; 257/611
(58) Field of Search ............................... 257/616, 627, 257/369, 611

(56) References Cited

U.S. PATENT DOCUMENTS

| 5,126,805 | A | * | 6/1992 | Bulat et al. ................. 257/136 |
| 5,162,246 | A | | 11/1992 | Ozturk et al. |
| 5,168,072 | A | | 12/1992 | Moslehi |
| 5,298,457 | A | * | 3/1994 | Einthoven et al. ........... 438/492 |
| 6,214,679 | B1 | | 4/2001 | Murthy et al. |
| 6,235,560 | B1 | * | 5/2001 | Ma et al. ..................... 438/150 |
| 6,235,568 | B1 | | 5/2001 | Murthy et al. |
| 6,589,827 | B2 | * | 7/2003 | Kubo et al. .................. 438/157 |
| 6,723,622 | B2 | * | 4/2004 | Murthy et al. ............... 438/507 |
| 6,787,852 | B1 | * | 9/2004 | Yu et al. ...................... 257/347 |
| 6,812,086 | B2 | * | 11/2004 | Murthy et al. ............... 438/231 |
| 2003/0153155 | A1 | * | 8/2003 | Wang et al. .................. 438/300 |

* cited by examiner

*Primary Examiner*—Alexander Ghyka
(74) *Attorney, Agent, or Firm*—Blakely, Sokoloff, Taylor & Zafman LLP

(57) ABSTRACT

Transistors are manufactured by growing germanium source and drain regions, implanting dopant impurities into the germanium, and subsequently annealing the source and drain regions so that the dopant impurities diffuse through the germanium. The process is simpler than a process wherein germanium is insitu doped with p-type or n-type impurities. The dopant impurities diffuse easily through the germanium but not easily through underlying silicon, so that an interface between the germanium and silicon acts as a diffusion barrier and ensures positioning of the dopant atoms in the regions of the device where they improve transistor performance.

3 Claims, 8 Drawing Sheets

Activation of B-implanted Ge deposited on Si

Activation of P-implanted Ge deposited on Si

METHOD OF MAKING A SEMICONDUCTOR TRANSISTOR

CROSS-REFERENCE TO OTHER APPLICATIONS

This Application is a divisional of U.S. patent application Ser. No. 10/197,041, filed on Jul. 16, 2002 now U.S. Pat. No. 6,812,086.

BACKGROUND OF THE INVENTION

1). Field of the Invention

This invention relates to a method of making a semiconductor transistor.

2). Discussion of Related Art

Integrated circuits are usually manufactured in and on silicon and other semiconductor substrates. An integrated circuit may include millions of interconnected transistors that are formed over an area of a few square centimeters.

Such a transistor usually includes a gate dielectric layer on the silicon substrate, a gate electrode on the gate dielectric layer, and source and drain regions in the silicon substrate on opposite sides of the gate electrode. The source and drain regions are usually made by implanting dopant impurities into the silicon substrate and subsequently heating or "annealing" the entire structure to cause diffusion of the dopant impurities into the silicon substrate. No barrier exists in the silicon substrate that would limit diffusion of the dopant impurities, so that the locations that the dopant impurities diffuse to cannot be tightly controlled.

Achieving high transistor performance requires very high implant doses and tight control over dopant placement and diffusion. One option might be to form source and drain recesses on opposite sides of the gate electrode, and subsequently filling the recesses with doped semiconductor material. Dopant impurities such as boron may, for example, be deposited together with a semiconductor material such as germanium. An additional advantage of doped germanium is that it has a lower sheet resistance than doped silicon. Such insitu doping of germanium with boron is, however, difficult to achieve.

BRIEF DESCRIPTION OF THE DRAWINGS

The invention is described by way of example with reference to the accompanying drawings, wherein.

DETAILED DESCRIPTION OF THE INVENTION

Transistors are manufactured by growing germanium source and drain regions, implanting dopant impurities into the germanium, and subsequently annealing the source and drain regions so that the dopant impurities diffuse through the germanium. The process is simpler than a process wherein germanium is insitu doped with p-type or n-type impurities. The dopant impurities diffuse easily through the germanium but not easily through underlying silicon, so that an interface between the germanium and silicon acts as a diffusion barrier.

In the following description, an example is provided wherein boron and phosphorous are used as p-type and n-type impurities. Other impurities, such as antimony, gallium, indium, and arsenic, may be used instead and with varying degrees of success.

Figure 1:
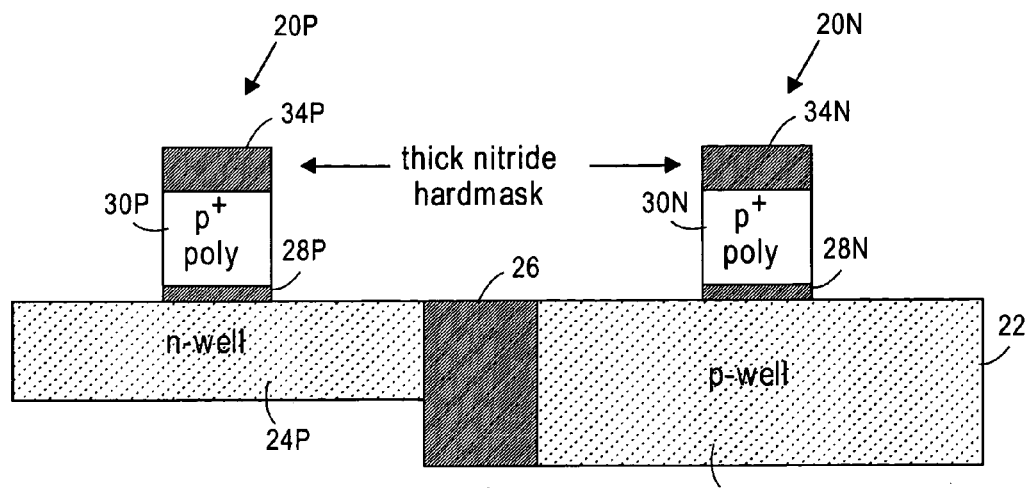
FIG. 1 is a cross-sectional side view illustrating adjacent transistors that are manufactured according to a conventional complementary metal oxide semiconductor (CMOS) process.

FIG. 1 of the accompanying drawings illustrates the manufacture of two adjacent transistors 20 on a silicon substrate 22. The transistor that is manufactured on the left is a metal-oxide semiconductor transistor that is made on an n-type substrate, and is hereinafter referred to as the "PMOS transistor 20P." The transistor on the right is a metal-oxide semiconductor transistor that is made on a p-type substrate, and is hereinafter referred to as the "NMOS transistor 20N."

The partially-manufactured transistors 20P and 20N shown in FIG. 1 are manufactured according to a conventional process. N-type dopants are implanted into the left of the silicon substrate 22 to form an n-well 24P. P-dopants are implanted into the right of the silicon substrate 22 to form a p-well 24N. The n-well 24P is separated from the p-well 24N by a silicon dioxide shallow trench isolation (STI) region 26.

Gate dielectric layers 28P and 28N are subsequently grown on the n-well 24P and the p-well 24N, respectively. The gate dielectric layers 28P and 28N are typically made from silicon dioxide or nitrided silicon dioxide, and are generally less than 40 Å thick. Polysilicon gate electrodes 30P and 30N are formed on the gate dielectric layers 28P and 28N, respectively. The polysilicon gate electrode 30P is doped with a p-type dopant such as boron, and the polysilicon gate electrode 30N is doped with an n-type dopant such as phosphorous or arsenic. Thick silicon nitride hard masks 34P and 34N are formed on the polysilicon gate electrode 30P and the polysilicon gate electrode 30N, respectively.

Figure 2:
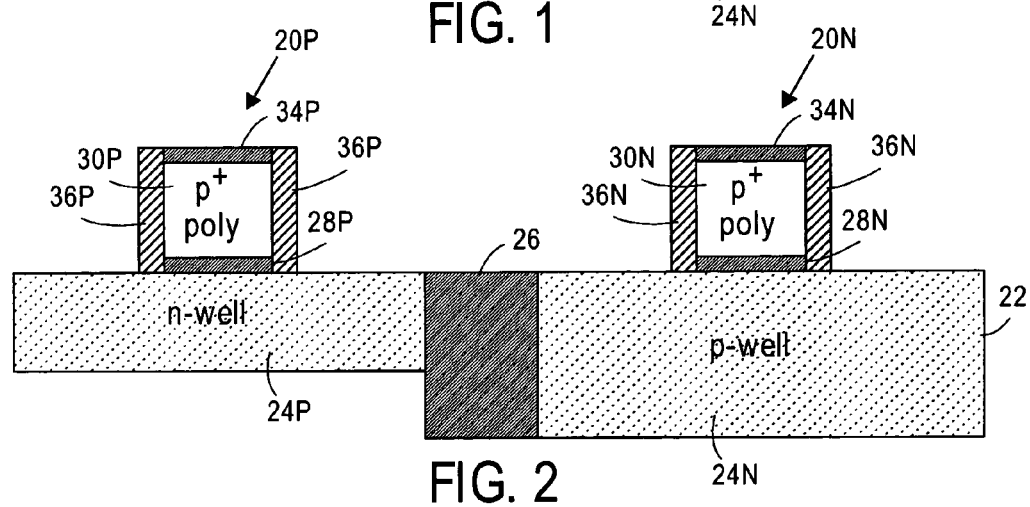
FIG. 2 is a view similar to FIG. 1, after the formation of sidewall spacers.

As further illustrated in FIG. 2, vertical sidewall spacers 36P are formed on opposing sides of the polysilicon gate electrode 30P. Similarly, vertical sidewall spacers 36N are formed on opposing sides of the polysilicon gate electrode 30N. The material of the sidewall spacers 36 is initially wider than shown. Subsequent etching of the material of the sidewall spacers 36 also reduces the thicknesses of the hard masks 34.

Figure 4:
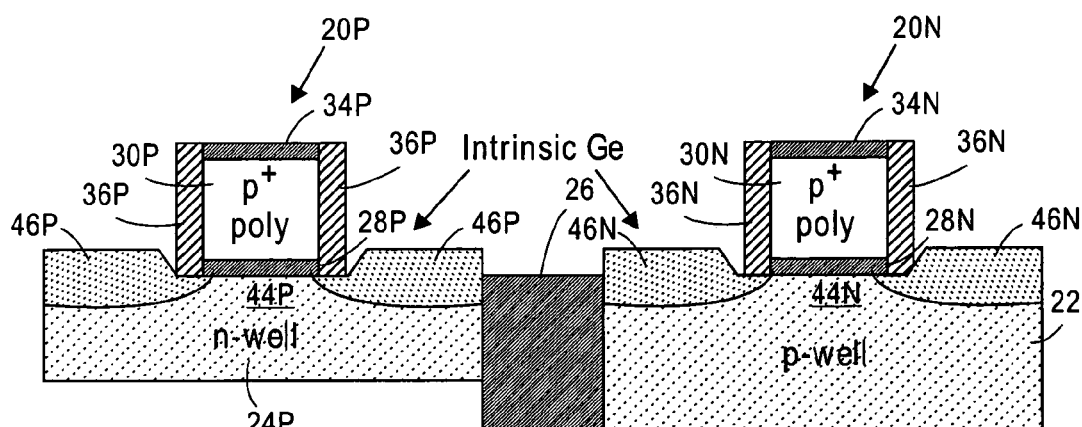
FIG. 4 is view similar to FIG. 3, after germanium source and drain regions are selectively grown in the recesses.

As illustrated in FIG. 4, recesses 40 are subsequently etched into an upper surface of the silicon substrate 22. An isotropic etchant such as $SF_6$ is used that selectively removes silicon over the materials of the shallow trench isolation region 26, gate dielectric layers 28, hard masks 34, and sidewall spacers 36. Etching is continued until tip portions 42 of the recesses 40 are formed below the gate dielectric layers 28. As such, source and drain recesses 40P are formed on opposing sides and below the polysilicon gate electrode 30P, and source and drain recesses 40N are formed on opposing sides and below the polysilicon gate electrode 30N. Each one of the source and drain recesses 40P has a respective tip portion 42P below the polysilicon gate electrode 30P, and each one of the source and drain recesses 40N has a respective tip portion 42N below the polysilicon gate electrode 30N. A channel region 44P is defined between the tip portions 42P, and a channel region 44N is defined between the tip portions 42N.

Figure 3:
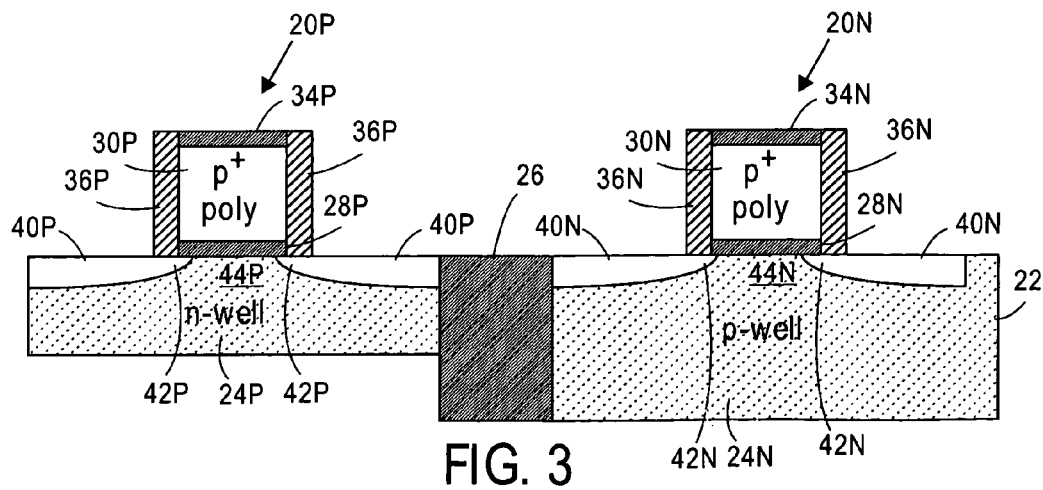
FIG. 3 is a view similar to FIG. 2, after recesses are etched into a silicon substrate of the structure of FIG. 2.

FIG. 4 illustrates the structure of FIG. 3 after the formation of source and drain regions 46P and source and drain regions 46N. The source and drain regions 46P are formed by epitaxially growing pure germanium within the source and drain recesses 40P. The source and drain regions 46N are formed by growing pure germanium within the source and drain recesses 40N. The source and drain regions 46P and 46N are formed simultaneously.

It should be noted that the germanium grows selectively on the material of the silicon substrate 22, as opposed to the materials of the shallow trench isolation region 26, gate dielectric layers 28, hard masks 34, and sidewall spacers 36. Germanium is grown by flowing germaine gas together with a precursor such as hydrogen into a chamber, and exposing the silicon substrate 22 to the gases at a temperature below 600° C.

A process for epitaxially growing germanium directly on silicon is described in U.S. patent application Ser. No. 10/081,099. The germanium atoms are slightly larger than the silicon atoms, which causes dislocations in the germanium. These dislocations do not affect the crystal alignment of the germanium, so that the germanium in bulk still has the same crystal structure and crystal alignment of the underlying silicon. The crystal alignment of the silicon is predetermined in an x-ray process, and because the crystal alignment of the germanium is the same as the crystal alignment of the silicon, the crystal alignment of the germanium is therefore also known. By knowing the crystal alignment of the germanium, an ion beam of an ion implantation device can be aligned with a select plane of the germanium, and dopant ions can be implanted into the germanium.

Figure 5:
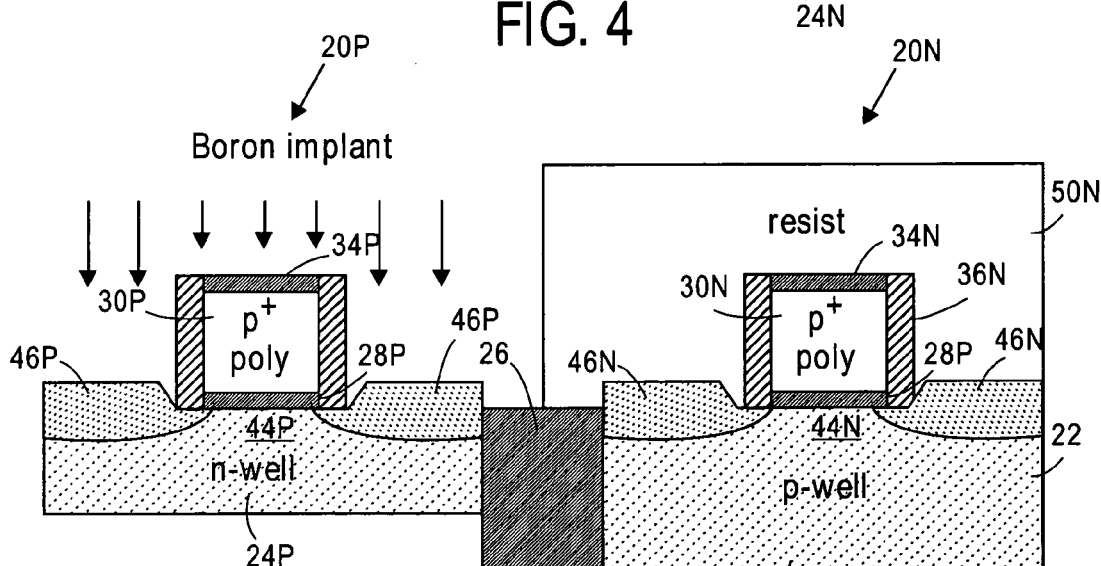
FIG. 5 is a view similar to FIG. 4, after a resist is deposited over the components of the transistor on the right, and while boron ions are implanted into the source and drain regions of the transistor on the left.

As illustrated in FIG. 5, the components of the NMOS transistor 20N are covered with a resist 50N. The entire structure is then exposed to a boron ion beam. The boron implants into the germanium of the source and drain regions 46P. An ion beam of boron ions is aligned with a select plane of the crystal structure of the germanium of the source and drain regions 46P. Boron 11 ions are implanted at an energy of approximately 10 keV, with a dose of approximately $1\times10^{16}$ atoms/cm$^2$. It may be possible to use implantation energies between 5 and 100 keV. Boron implantation avoids the complexities of a process wherein deposited source and drain regions are insitu-doped with boron.

Figure 6:
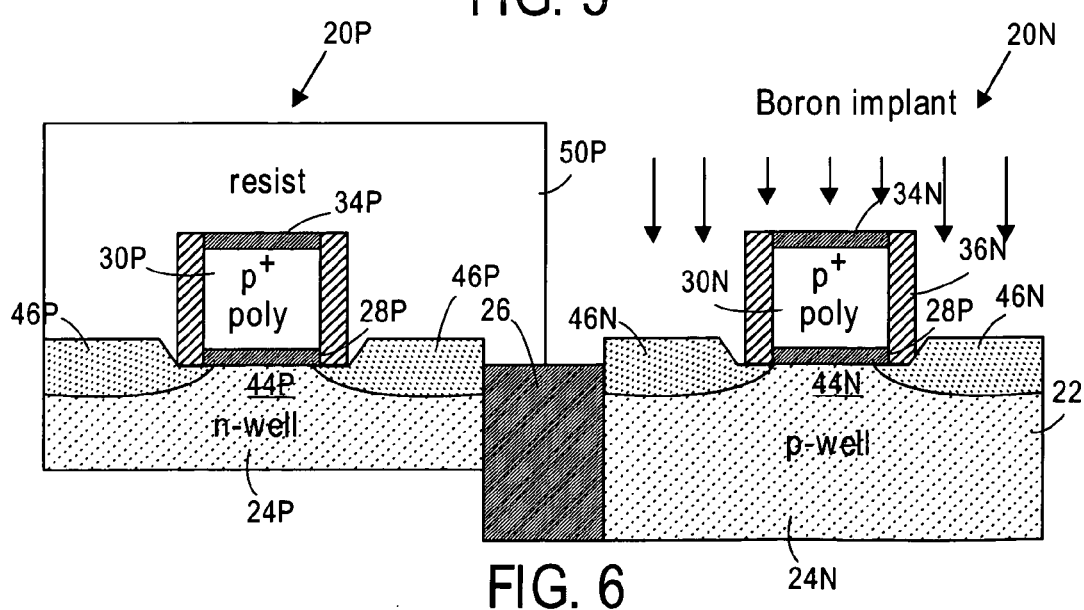
FIG. 6 is a view similar to FIG. 5 after the resist is removed, a resist is deposited over the components of the transistor on the left, and while phosphorous ions are implanted into the source and drain regions of the transistor on the right.

FIG. 6 illustrates a similar process to FIG. 5, except that the components of the PMOS transistor 20P are covered with a resist 50P, and phosphorous ions are implanted into the germanium of the source and drain regions 46N. Phosphorous 31 ions are implanted at an energy level of approximately 25 keV, with a dose of approximately $1\times10^{16}$ atoms/cm$^2$. Arsenic may be implanted in an alternative embodiment.

Figure 7:
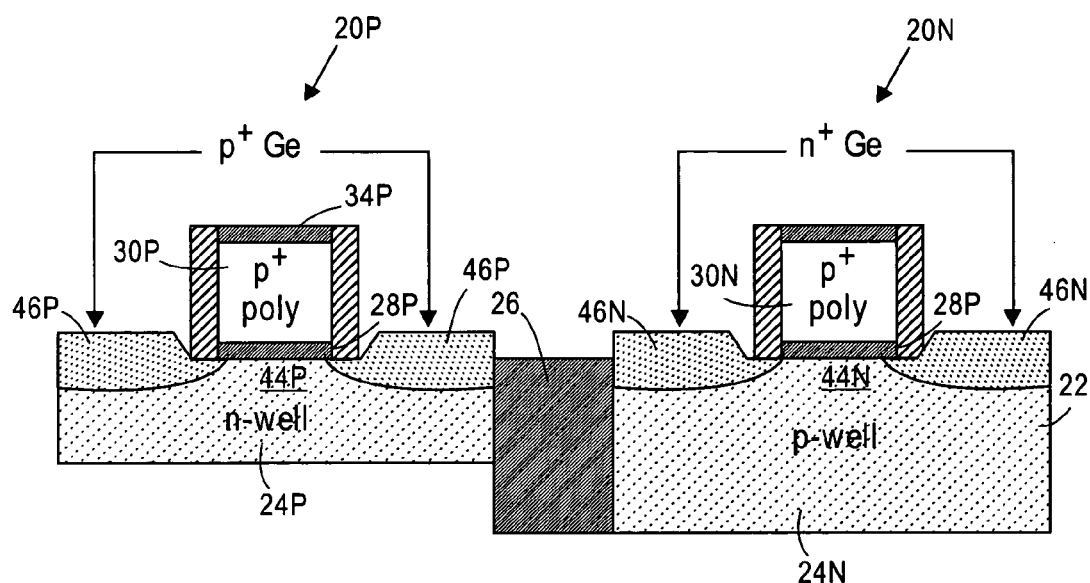
FIG. 7 is a view similar to FIG. 6, after the resist is removed.

The resist 50P is subsequently removed to leave a structure such as is shown in FIG. 7. The structure of FIG. 7 is subsequently heated in a rapid thermal process at approximately 600° C. Heating or "annealing" of the source and drain regions 46P and 46N causes diffusion of the boron and phosphorous through the germanium. Diffusion of the boron and phosphorous impurities causes activation of the source and drain regions 46P and 46N so that they become conductive.

Figure 8:
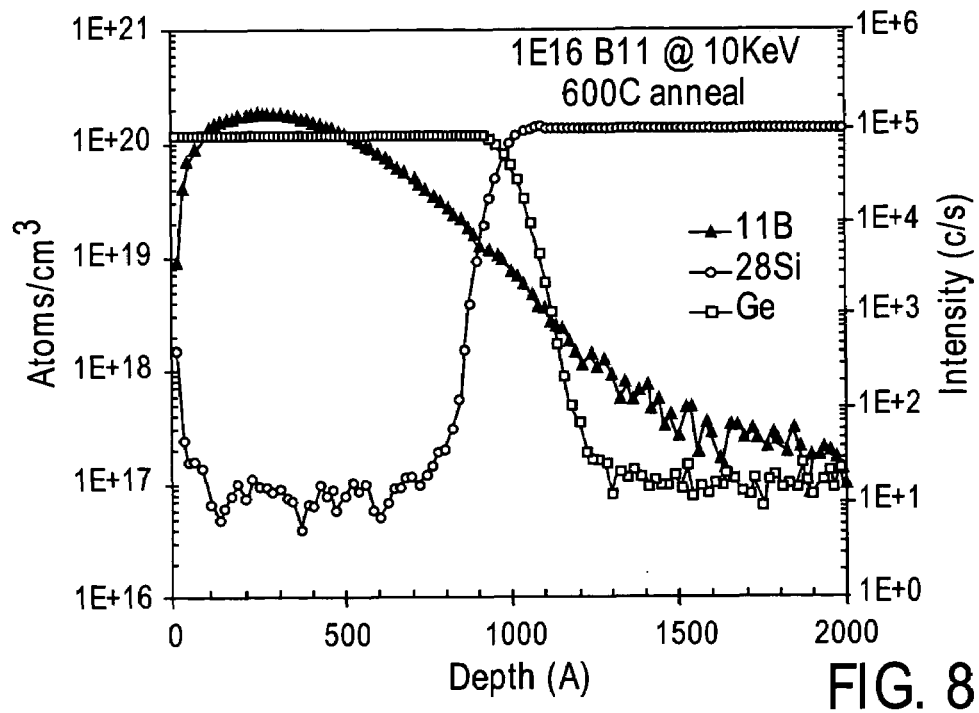
FIG. 8 is a graph illustrating diffusion of boron ions in the germanium and the underlying silicon.

FIG. 8 illustrates the concentration of the boron in the germanium and the underlying silicon. Non-uniformities in the depth of the interface contribute to measurement errors and account for the figure showing a gradual transition from germanium to silicon. There is, in fact, an abrupt transition from the germanium to the silicon. An average depth of the transition is approximately 1000 Å. Boron concentration is the highest at approximately 250 Å, and then decreases toward the interface between the germanium and the silicon. Some of the boron diffuses into the silicon, and a gradual decrease in boron concentration is evident in the silicon.

Figure 9:
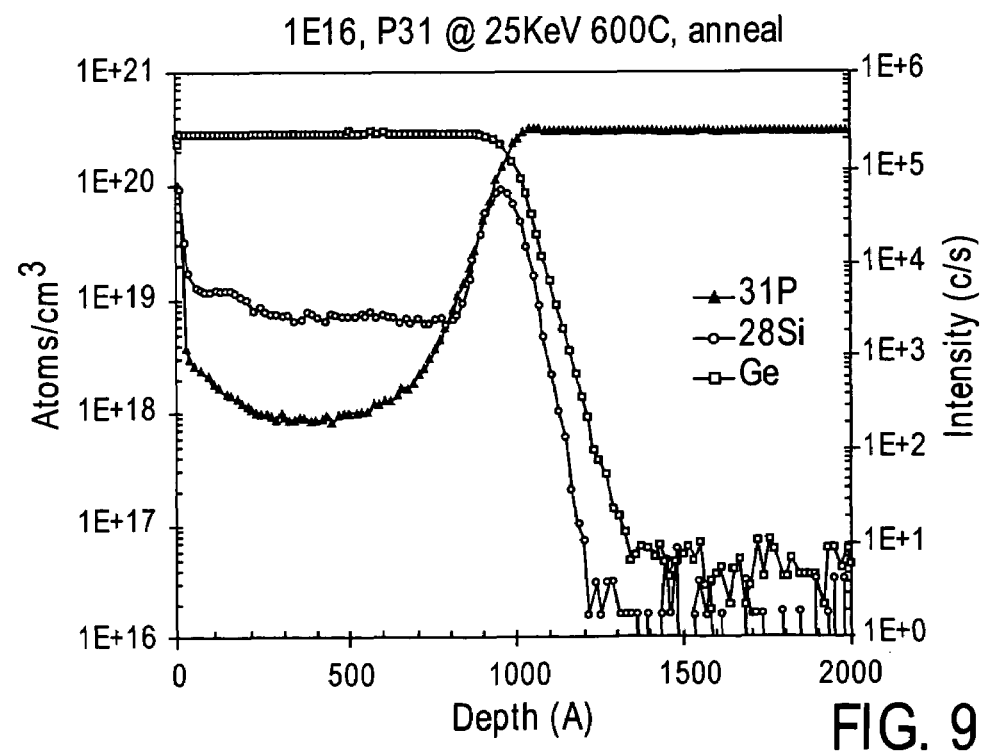
FIG. 9 is a graph illustrating diffusion of phosphorous into the germanium and the underlying silicon.

As illustrated in FIG. 9, there is an increase in phosphorous concentration in the germanium approaching the interface between the germanium and the silicon, at a depth from approximately 900 Å to 1000 Å. There is then an abrupt reduction, or sharp drop-off, in phosphorous concentration so that substantially no phosphorous diffuses into the underlying silicon. The slope in the phosphorous concentration from 1000 Å to 1200 Å is largely due to nonuniformities in the depth of the interface between the germanium and the silicon, and is therefore largely due to a measurement error. Phosphorous, in particular, thus has the advantage that it only diffuses in the specifically defined area of the germanium. Boron displays similar properties, but not to the same extent as phosphorous. Further numerical details are evident from the figure and the figures that follow.

Figure 10:
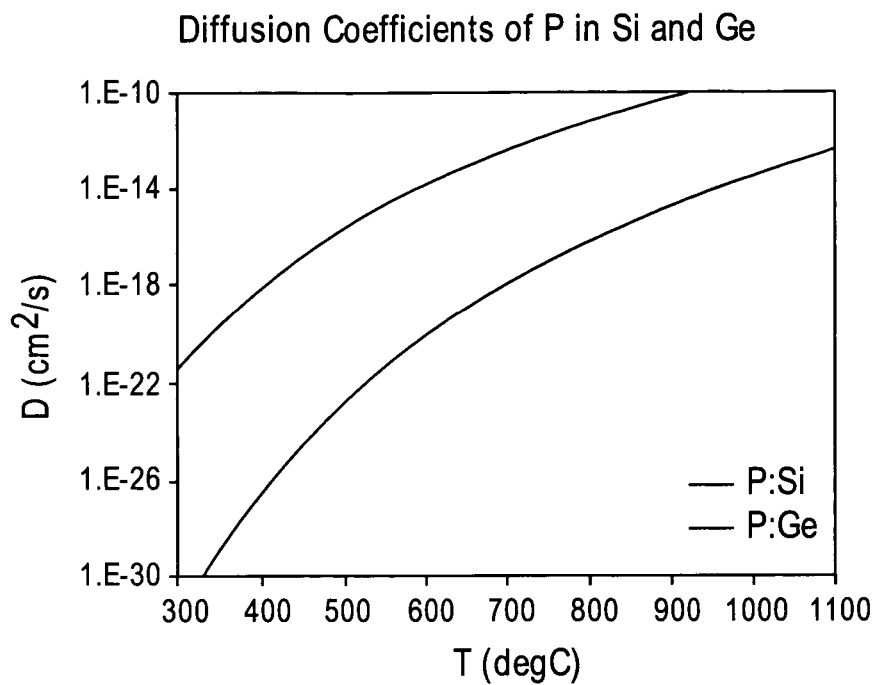
FIG. 10 is a graph illustrating calculated diffusion coefficients of phosphorous in silicon and germanium at different temperatures.
Figure 11:
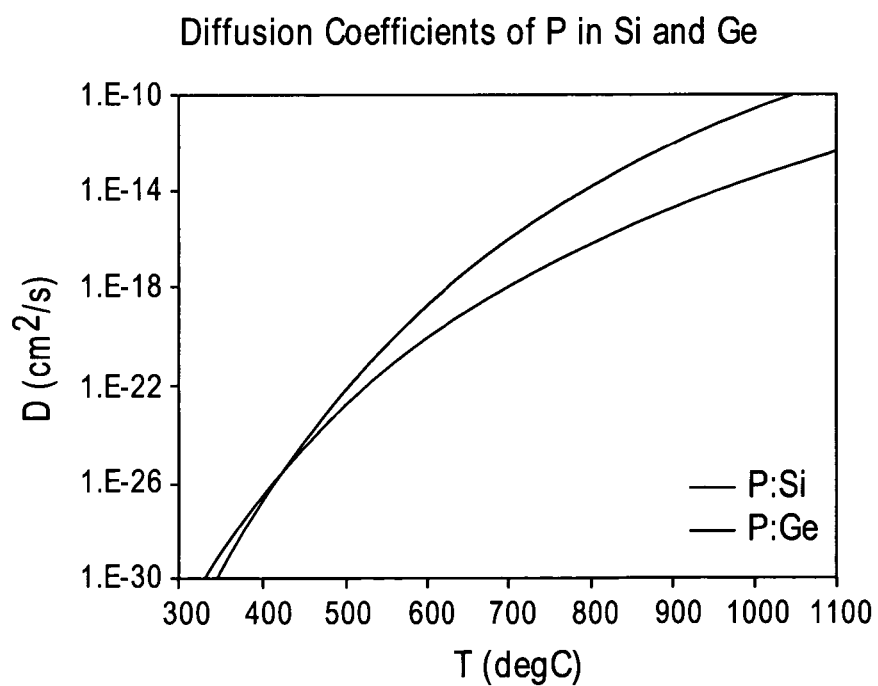
FIG. 11 is a graph illustrating calculated diffusion coefficients of boron in silicon and germanium at different temperatures.

FIG. 10 illustrates the calculated diffusion coefficients of phosphorous in silicon and germanium, respectively. The phosphorous diffuses at a higher rate in germanium than in silicon. At 600° C., the diffusion coefficient of phosphorous in germanium is approximately $1\times10^{-14}$, and approximately $1\times10^{-21}$ in silicon. The diffusion coefficient in germanium is $1\times10^7$ times higher in germanium than in silicon when both materials are at 600° C. FIG. 11 illustrates diffusion coefficients of boron in silicon and germanium, respectively. At 600° C., the boron diffusion is approximately 10 times higher in germanium than in silicon.

Figure 12:
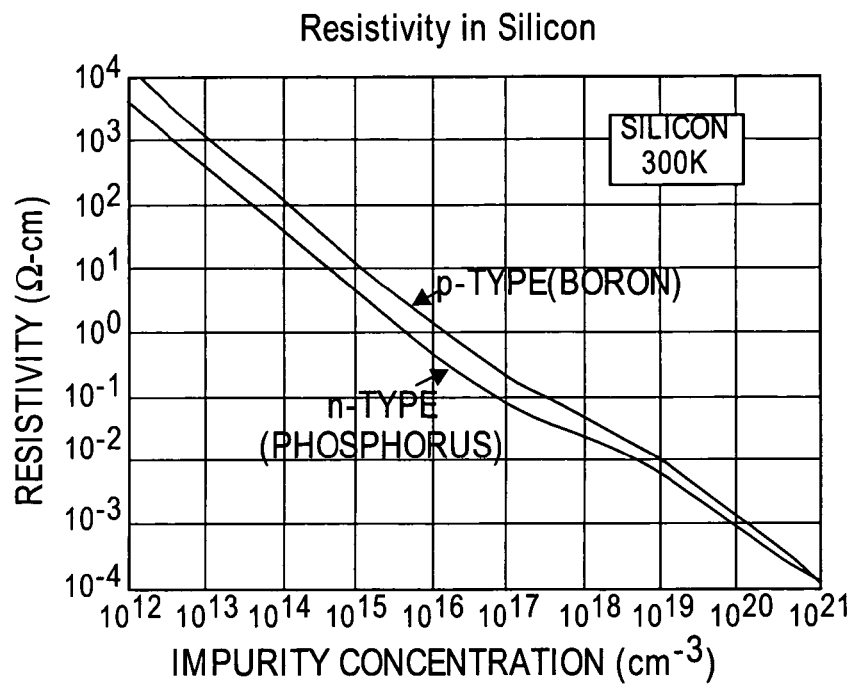
FIG. 12 is a graph illustrating resistivity of silicon which is doped with impurities.
Figure 13:
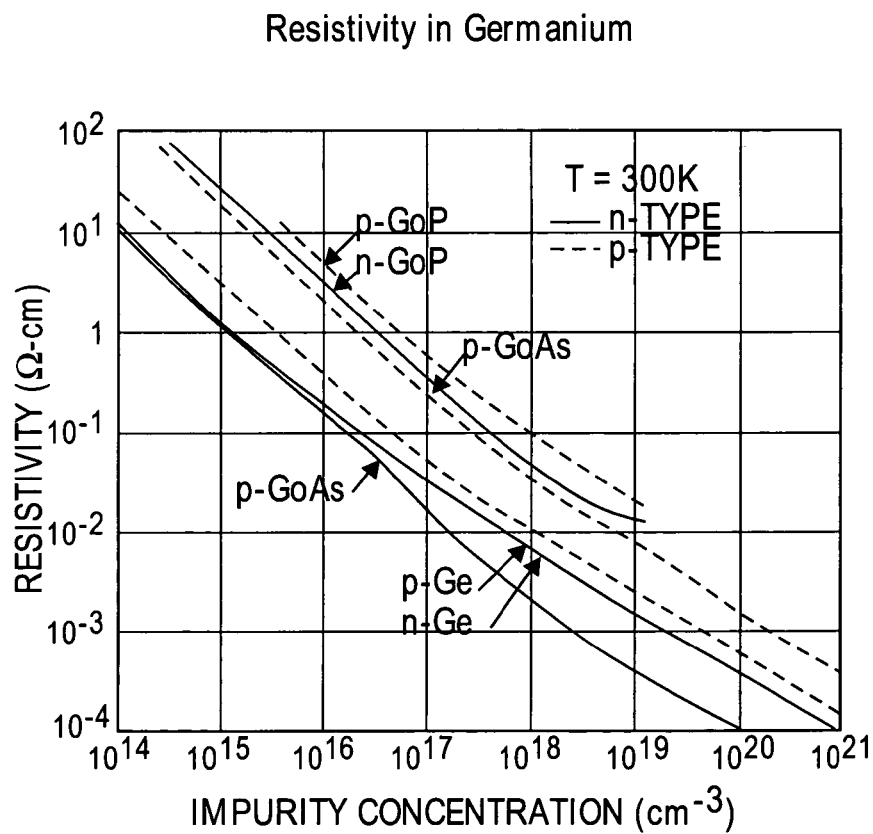
FIG. 13 is a graph that illustrates the resistivity of germanium which is doped with impurities.

FIG. 12 illustrates the resistivity of silicon after being doped with boron or phosphorous impurities, and FIG. 13 illustrates the resistivity of germanium after being doped with phosphorous or arsenic impurities. FIGS. 12 and 13 are from Pages 32 and 33 of *Physics of Semiconductor Devices*, second edition, by S. M. Sze, John Wiley & Sons. From FIG.

12 it can be seen that an impurity concentration of $10^{17}$ cm$^{-3}$ boron renders a resistivity of approximately $10^{-1}$ Ω-cm. As shown in FIG. 13, a similar dopant concentration of $10^{17}$ cm$^{-3}$ boron gives a resistivity of approximately $10^{-2}$ Ω-cm in germanium.

Figure 14:
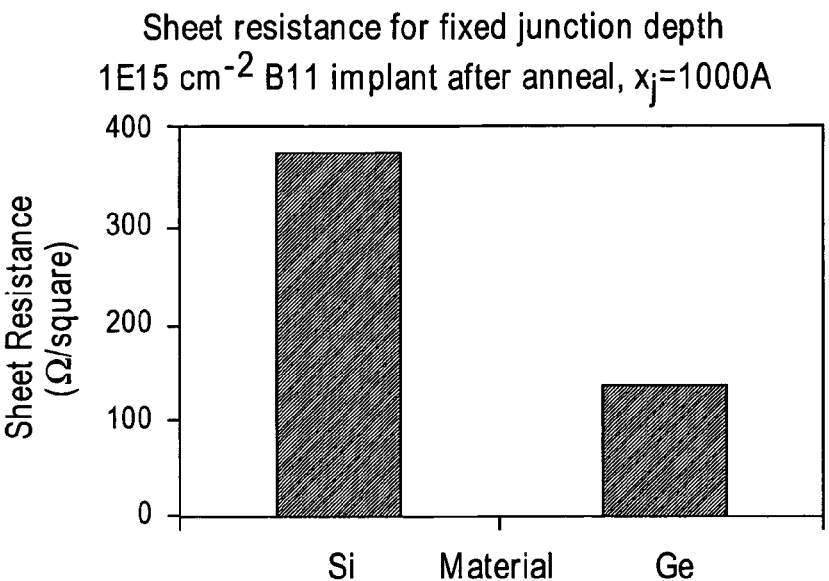
FIG. 14 is a graph that compares the resistivities of silicon and germanium having similar concentrations of boron.

FIG. 14 illustrates the relative resistivities in silicon and germanium after being implanted with similar doses of boron and then annealed. The germanium resistivity is approximately 40% of the resistivity of the silicon.

Figure 15:
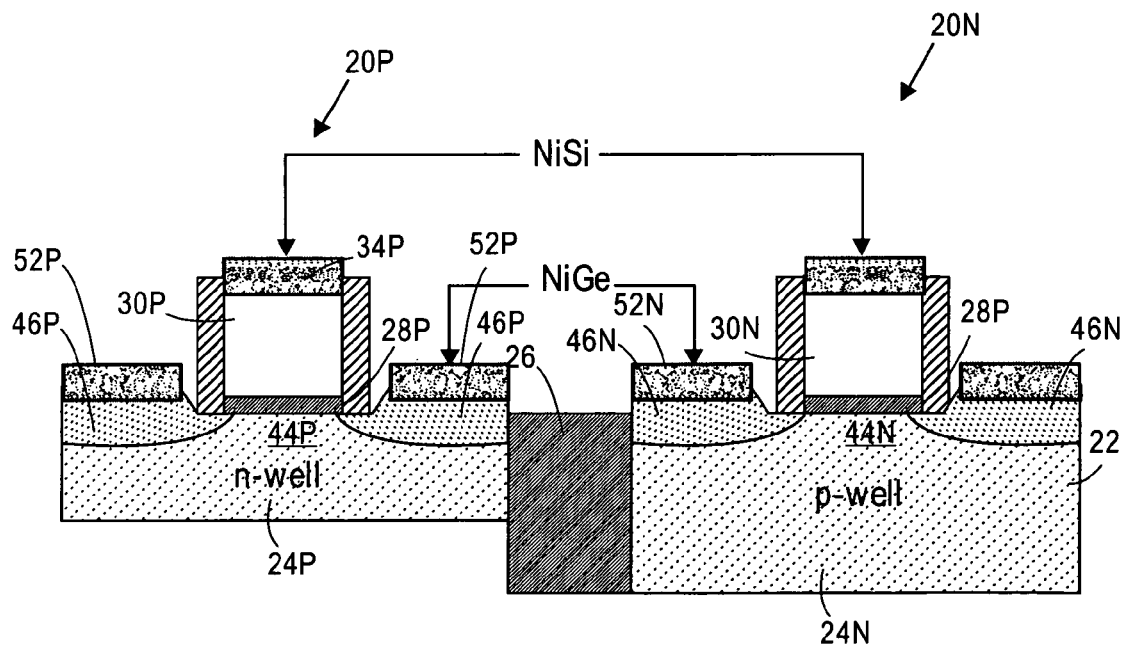
FIG. 15 is a view similar to FIG. 7 after nickel metal layers are formed for purposes of making conductive contacts.
Figure 16:
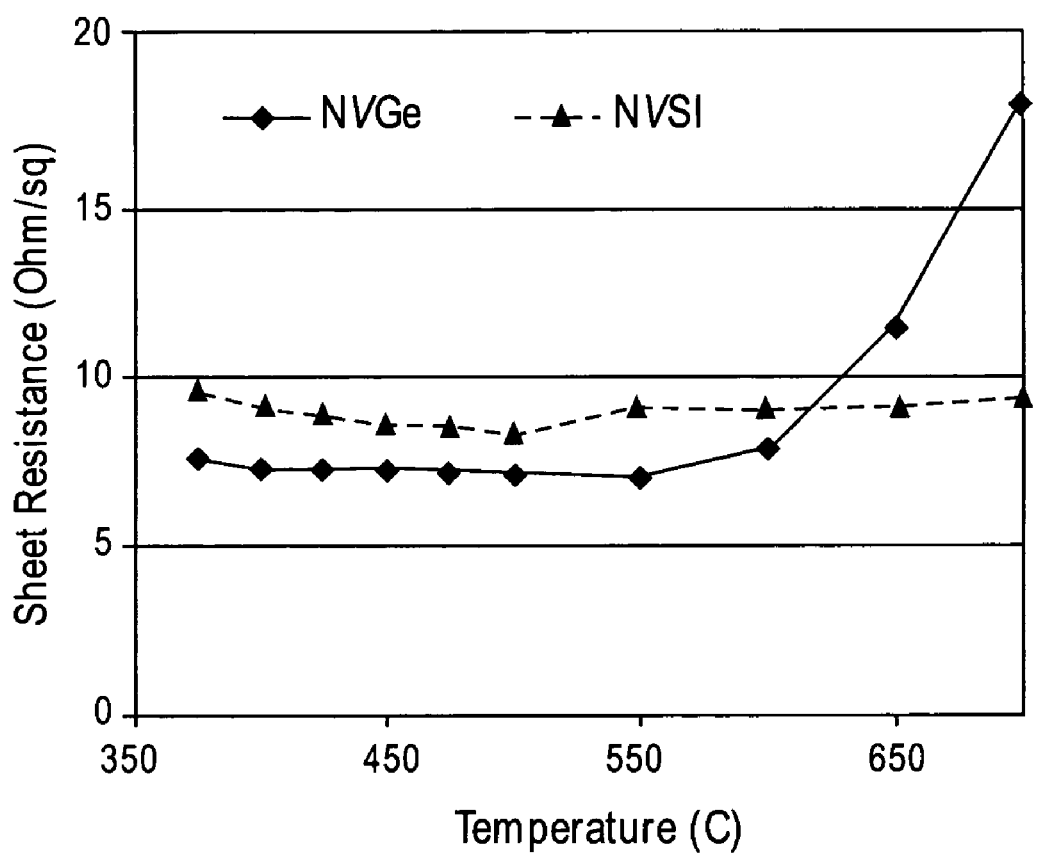
FIG. 16 is a graph illustrating sheet resistivities of nickel/germanium and nickel/silicon conductive regions of structures such as FIG. 15 after being annealed at different temperatures.

FIG. 15 illustrates the structure of FIG. 7 after a metallization step. Nickel metal layers 52P are formed on the source and drain regions 46P, nickel metal layers 52N are formed on the source and drain regions 46N, a nickel metal layer 54P on the polysilicon gate electrode 30P, and a nickel metal layer on the polysilicon gate electrode 30N. The entire structure of FIG. 15 is then annealed at a temperature of approximately 425° C. The nickel metal layers 54P and 54N react with the material of the polysilicon gate electrodes 30P and 30N, respectively, to form conductive silicide regions on the remainder of the polysilicon gate electrodes 30P and 30N. The nickel metal layers 52P and 52N simultaneously react with upper portions of the source and drain regions 46P and 46N to form conductive nickel/germanium regions. An advantage of using nickel is that nickel can form a conductive region with both silicon and germanium. Cobalt is an example of a metal that does not react with germanium to form a conductive region.

FIG. 12 illustrates the sheet resistance of nickel/silicide silicon conductive regions and nickel/germanium conductive regions that have been annealed at different temperatures. Agglomeration tends to cause an increase in sheet resistance of a nickel/germanium conductive region that is formed at a temperature above 550° C. The anneal temperature is therefore preferably less than 550° C. The sheet resistance of a nickel/silicon conductive region tends to increase if annealed at a temperature above 475° C. The anneal temperature is therefore preferably less than 475° C.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A semiconductor transistor, comprising:
   a substrate of silicon having a channel region with first dopant impurities to have a first conductivity type;
   a gate dielectric layer on the channel region;
   a conductive gate electrode on the gate dielectric layer; and
   source and drain regions on opposite sides of the channel region, the source region being made of a germanium-containing material having second dopant impurities therein to have a second conductivity type opposite to the first conductivity type, there being a relatively sharp drop-off in concentration at an interface between the germanium-containing material and the silicon.

2. The semiconductor transistor of claim 1, wherein the second dopant impurities have an increase in concentration approaching the interface.

3. The semiconductor transistor of claim 1, wherein the germanium-containing material forms tips of the source and drain regions below the gate electrode.

\* \* \* \* \*